(12) United States Patent
Ban et al.

(10) Patent No.: US 7,112,859 B2
(45) Date of Patent: Sep. 26, 2006

(54) STEPPED TIP JUNCTION WITH SPACER LAYER

(75) Inventors: Ibrahim Ban, Beaverton, OR (US); Bernhard Sell, Portland, OR (US); Sanjay Natarajan, Portland, OR (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 10/847,987

(22) Filed: May 17, 2004

(65) Prior Publication Data

US 2005/0253192 A1    Nov. 17, 2005

(51) Int. Cl.
*H01L 29/76*    (2006.01)
*H01L 21/336*   (2006.01)

(52) U.S. Cl. .................. 257/408; 257/900; 438/303
(58) Field of Classification Search ............... 257/408, 257/344, 900; 438/303
See application file for complete search history.

(56) References Cited

U.S. PATENT DOCUMENTS

| 5,747,373 | A | 5/1998 | Yu | 438/305 |
|---|---|---|---|---|
| 5,994,747 | A * | 11/1999 | Wu | 257/408 |
| 5,998,274 | A | 12/1999 | Akram et al. | 438/306 |
| 6,144,071 | A * | 11/2000 | Gardner et al. | 257/344 |
| 6,225,176 | B1 | 5/2001 | Yu | 438/305 |
| 6,258,680 | B1 | 7/2001 | Fulford, Jr. et al. | 438/305 |
| 6,548,877 | B1 * | 4/2003 | Yang et al. | 257/382 |
| 6,917,085 | B1 * | 7/2005 | Bae et al. | 257/408 |
| 2002/0008295 | A1 | 1/2002 | Yang et al. | 257/413 |
| 2004/0056301 | A1 * | 3/2004 | Ahmed et al. | 257/327 |

OTHER PUBLICATIONS

IBM Technical Disclosure Bulletin (vol. 22, No. 11, pp. 5146-5147, by Bassous et al), Apr. 1980.*
James R. Pfiester, "Surface-Graded LDD MOSFET", Motorola Technical Developments, vol. 9, Aug. 1989.

* cited by examiner

*Primary Examiner*—Mark V. Prenty
(74) *Attorney, Agent, or Firm*—Michael D. Plimier

(57) ABSTRACT

Embodiments of the invention provides a stepped tip junction region between a source/drain region of a transistor and a gate. In some embodiments, a spacer of the transistor includes a tip junction spacer layer and a source/drain spacer layer.

17 Claims, 8 Drawing Sheets

STEPPED TIP JUNCTION WITH SPACER LAYER

BACKGROUND

Background of the Invention

In a metal oxide semiconductor ("MOS") transistor, a relatively deep source/drain region in a substrate is spaced apart from a gate of the transistor. A "tip junction" region that is shallower than the source/drain region is between the source/drain region and the gate. The tip junction region provides a tradeoff. A shallower tip junction region provides better short-channel effect control but increases resistance. A deeper tip junction region reduces resistance but provides worse short-channel effect control.

DETAILED DESCRIPTION

Figure 1:
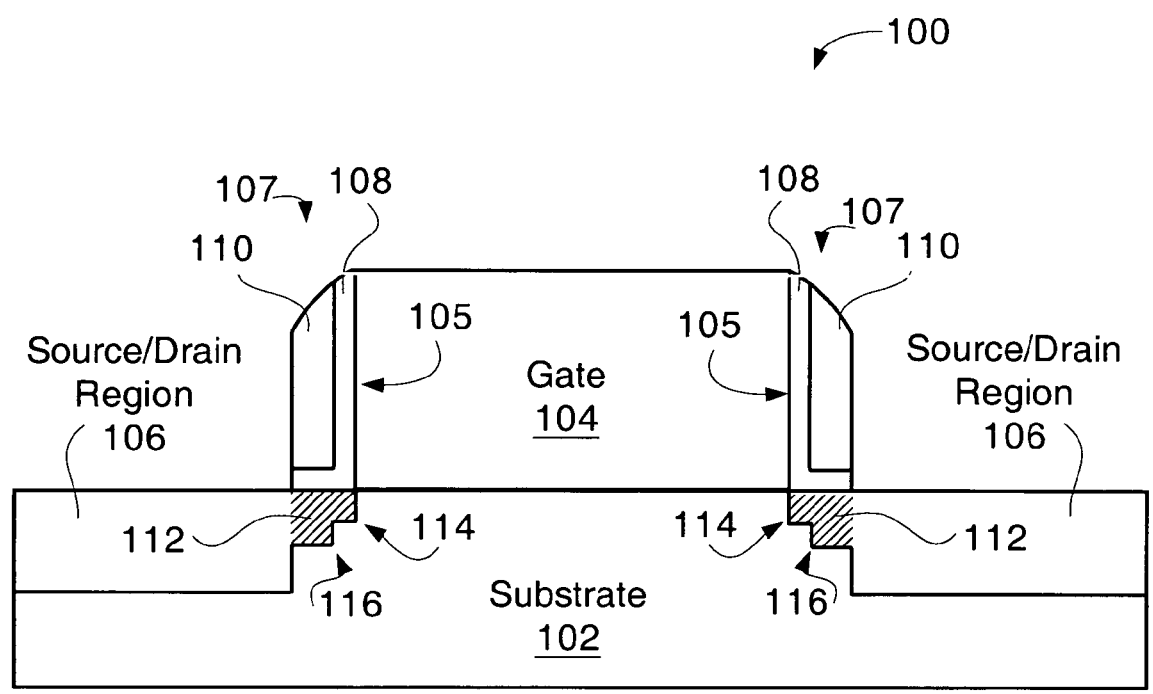
FIG. 1 is a cross sectional side view of a metal oxide semiconductor (MOS) transistor according to one embodiment of the present invention.

FIG. 1 is a cross sectional side view of a metal oxide semiconductor (MOS) transistor 100 according to one embodiment of the present invention. The transistor 100 of FIG. 1 has been simplified and stylized for clarity. In reality, the transistor 100 may include other layers or structures than as illustrated in FIG. 1. Further, the scale of an actual transistor may be different than as shown, and the boundaries of layers and structures, illustrated largely as straight lines in FIG. 1, may not be as geometrically perfect as illustrated.

In an embodiment, the transistor 100 may include a substrate 102. The substrate 102 may be one of a wide selection of surfaces used or made during semiconductor or other processing methods. The substrate 102 may comprise a semiconductor material such as silicon, in an embodiment. In other embodiments, the substrate 102 may be a physical structure, a layer that is a basic workpiece transformed and/or added to by various processes into the desired microelectronic configuration, or another material or materials. The substrate 102 may include conducting material, insulating material, semiconducting material, and other materials or material combinations. In some embodiments, the substrate 102 may be a multilayered structure.

There may be a gate 104 on the substrate 102. The gate 104 may include one or more layers of materials. For example, in one embodiment the gate 104 may include a layer of polysilicon material at least partially surrounded by a layer of oxide material. In other embodiments, the gate 104 may include different structures or layers. The gate 104 may have side walls 105 at the lateral boundaries of the gate 104.

The transistor 100 may include one or more source/drain regions 106. These source/drain regions 106 may be regions of the substrate 102 that have been heavily doped with ions, such as arsenic ions or other ions. The source/drain regions 106 may be spaced a distance away from the side walls 105 of the gate 104.

The transistor 100 may further include spacers 107 adjacent to the side walls 105 of the gate 104. Each spacer 107 may include one or more layers. For example, in one embodiment the spacer 107 may include a tip junction spacer layer 108 and a source/drain spacer layer 110. The source/drain regions 106 may be spaced away from the side walls 105 of the gate 104 at a distance approximately equal to the width of the spacer 107 in an embodiments, although other arrangements are possible.

The transistor 100 may further include stepped tip junction regions 112. These stepped tip junction regions 112 may be located between the source/drain regions 106 and the gate 104. Each tip junction region 112 may be a region of the substrate 102 that has been doped with ions, such as arsenic ions. The stepped tip junction region 112 may have two or more steps. For example, in the transistor 100 illustrated in FIG. 1, the stepped tip junction region 112 includes two steps 114, 116.

The first step 114 may also be considered a first tip junction region, or a first portion of the stepped tip junction region 112. The second step 116 may also be considered a second tip junction region, or a second portion of the stepped tip junction region 112. In an embodiment, the first step 114 may have a depth below the top surface of the substrate 102 less than the depth of the second step 116. The first step 114 may also extend closer to the gate 104 than the second step 116, which may extend closer to the gate 104 than the source/drain region 106. Such a stepped tip junction region 112 may provide a very shallow region, the first step 114, adjacent the gate 104 to provide good short channel effect control of the transistor 100, while still providing a deeper region, the second step 116, further from the gate 104 to reduce resistance.

Figure 2:
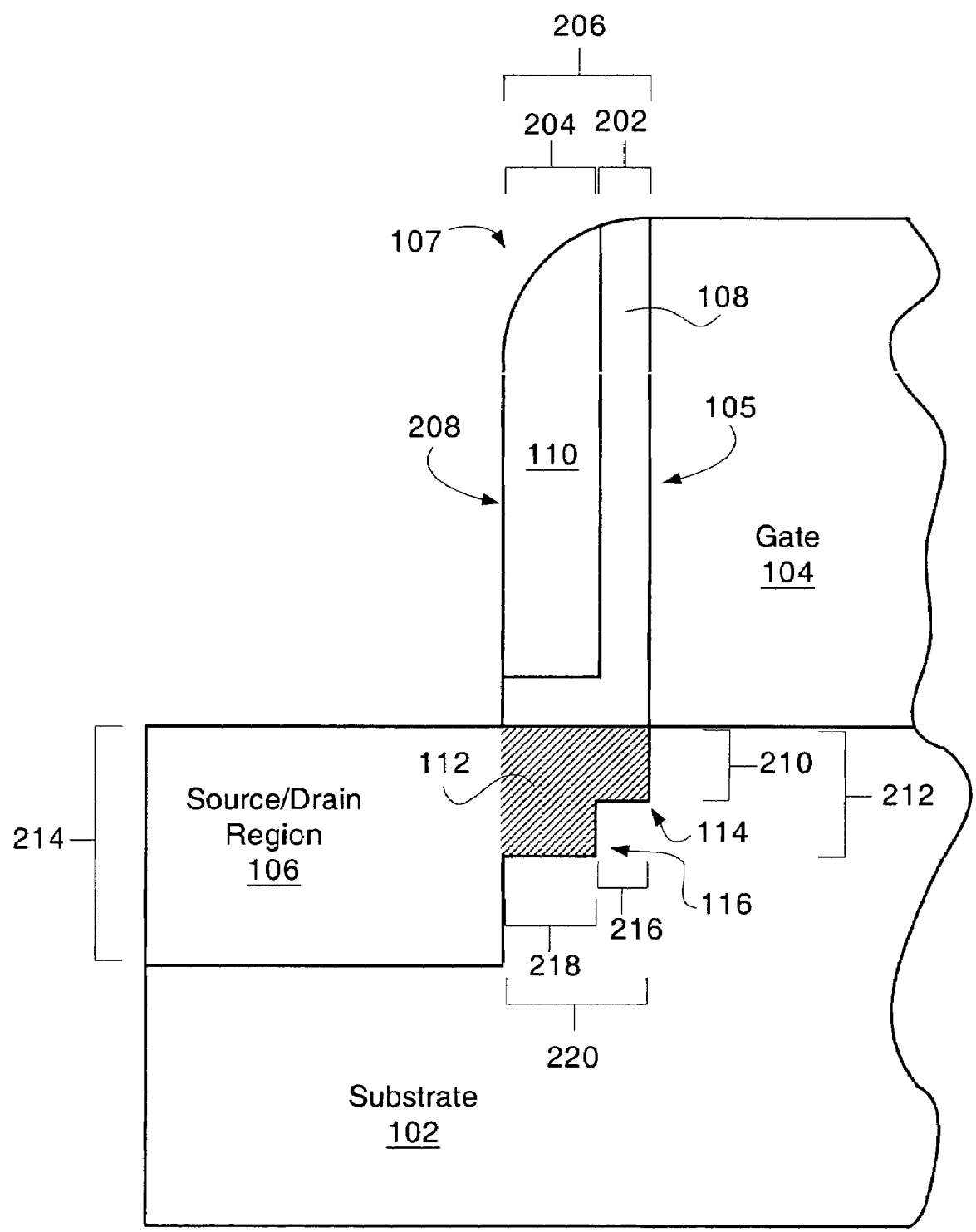
FIG. 2 is a closer view of a portion of the transistor illustrated in FIG. 1.

FIG. 2 is a closer view of a portion of the transistor 100 illustrated in FIG. 1, and includes a portion of the gate 104, a spacer 107, a portion of the substrate 102, a portion of a source/drain region 106, and a stepped tip junction region 112.

The spacer 107 may have a width 206, which may include a width of the tip junction spacer layer 108 and the width of the source/drain spacer layer 110 in some embodiments. In some embodiments, the width 202 of the tip junction spacer layer 108 may be less than about 20 nanometers, or may be between about 5 and 15 nanometers, although other widths 202 may be used. In one embodiment, the width 202 of the tip junction spacer layer 108 may be about 10 nanometers. In some embodiments, the source/drain spacer layer 110 may have a width 204 greater than the width 202 of the tip junction spacer layer 108, such as a width 204 about twice as great as the width 202 of the tip junction spacer layer 108, although other widths 204 may be used. The spacer 107 may further have an outer edge 208 that may be furthest from the side wall 105 of the gate 104.

The first step 114 of the stepped tip junction region 112 may have a first depth 210. The depth 210 may be in a range of about ten to fifteen nanometers in an embodiment, although the depth 210 may be greater or less. In one embodiment, the depth 210 may be about ten nanometers. This depth 210 may be less than the depth of tip junction regions in transistors that lack multiple steps in the tip junction region; for example, the depth 210 may be about 30% less.

The second step 116 of the stepped tip junction region 112 may have a second depth 212. The depth 212 of the second step may be greater than the depth 210 of the first step 114. For example, the depth 212 of the second step 116 may be about twice the depth 210 of the first step 114. In other embodiments, the depth 212 of the second step 116 may be more or less than twice the depth 210 of the first step 114.

The source/drain region 106 may have a depth 214, which may be greater than both of the depth 210 of the first step 114 and the depth 212 of the second step 116.

Note that while the depths 210, 212, 214 of the first step 114, the second step 116, and the source/drain region 106 as illustrated have abrupt lower boundaries, in some embodiments the lower boundaries may not be so well defined. The ion implantation that forms the source/drain region 106 and portions of the stepped tip junction region 112 may form graded regions that have more ions closer to the top surface of the substrate 102 and less ions lower. Thus, the term "depth" may mean a "junction depth," which is the depth at which the concentration of dopant in the junction falls about to the level of concentration of dopant in the substrate. (Note that the junction 112 and substrate 102 may be of opposite types, with one being "N" type and the other "P" type.)

The first step 114 may have a width 216. The width 216 of the first step 114 may be approximately equal to the width 202 of the tip junction spacer layer 108, although it may have a different width 216. The second step 116 may also have a width 218. The width 218 of the second step 116 may be approximately equal to the width 204 of the source/drain spacer layer 110. The width 218 may also be greater or less; for example the second step 116 may extend somewhat beyond the outer edge 208 of the source/drain spacer layer 110. The combined steps (first and second steps 114, 116 in FIG. 2) of the stepped tip junction layer 112 may have a width 220. This width may be approximately equal to the width 206 of the spacer 107. However, the width 220 may also be greater or less; for example the stepped tip junction layer 112 may extend somewhat beyond the outer edge 208 of the source/drain spacer layer 110.

Figure 3:
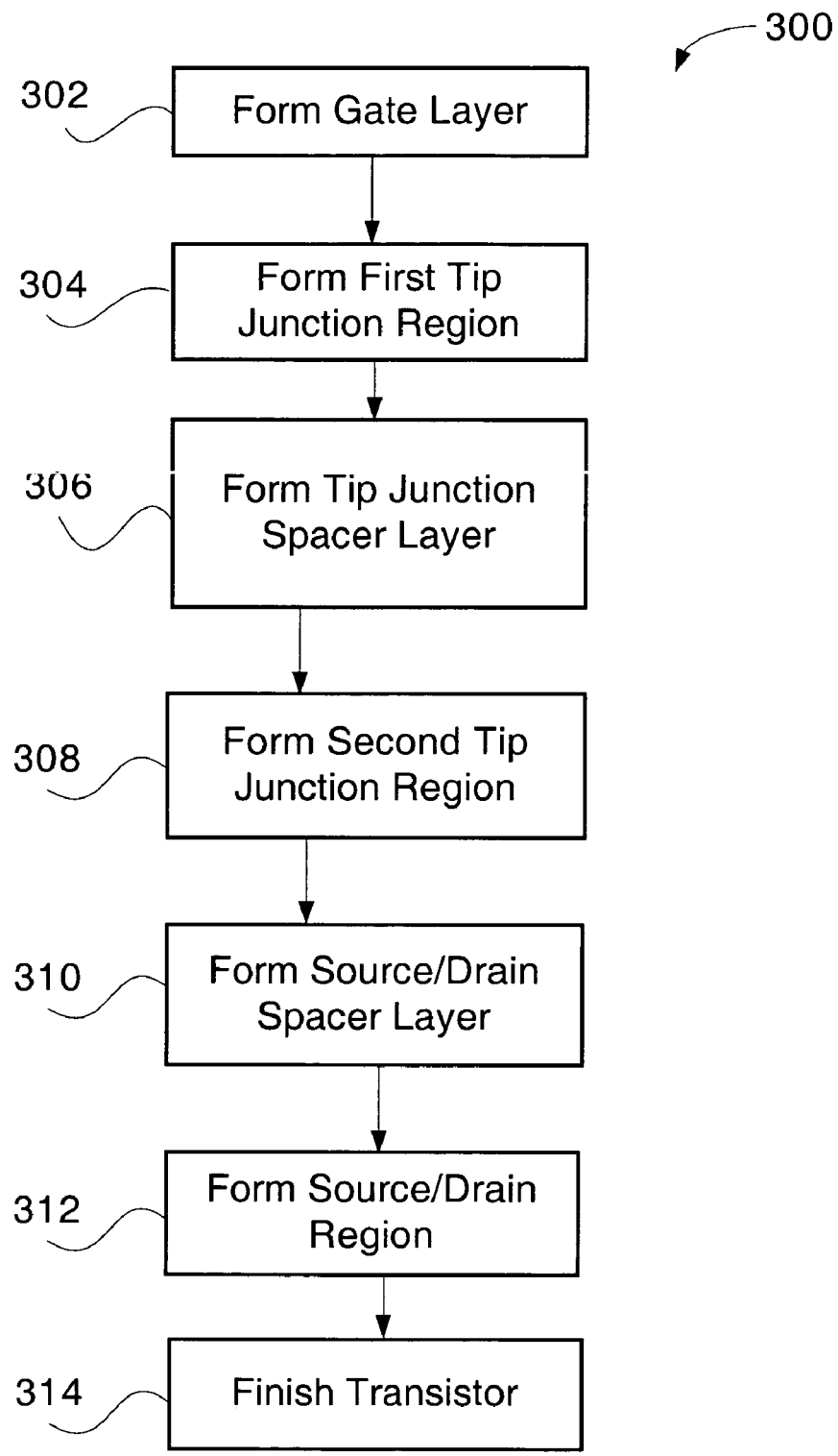
FIG. 3 is a flow chart that illustrates a method for making a transistor.

FIG. 3 is a flow chart 300 that illustrates a method for making a transistor, such as the transistor 100 of FIG. 1, according to one embodiment of the present invention. In other embodiments, some of the steps shown in the flow chart 300 may be omitted, other steps may be added, and/or the steps shown may be performed in a different order.

Figure 4:
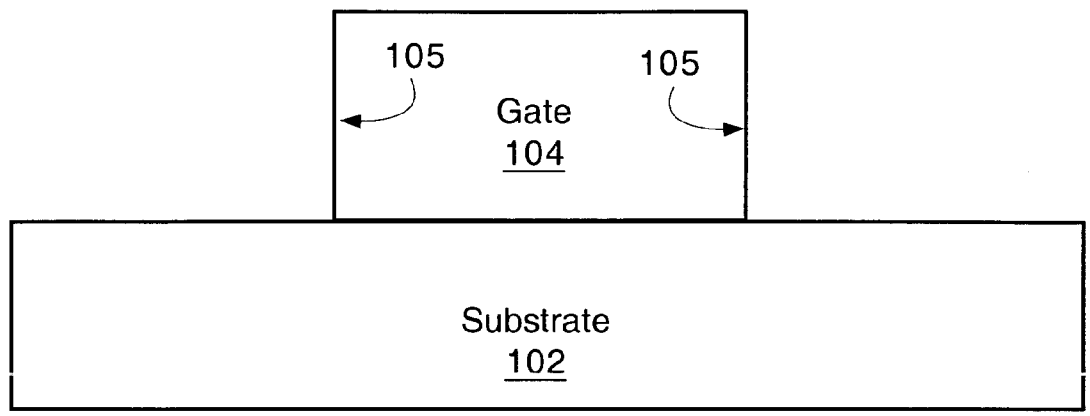
FIG. 4 is a cross sectional side view that illustrates the gate formed on the substrate.

The gate 104 may be formed 302 on the substrate 102. Forming 302 the gate 104 may include forming one or more gate layers that make up the gate 104. The gate layer may comprise a polysilicon material or another material. FIG. 4 is a cross sectional side view that illustrates the gate 104 formed 302 on the substrate 102.

Figure 5:
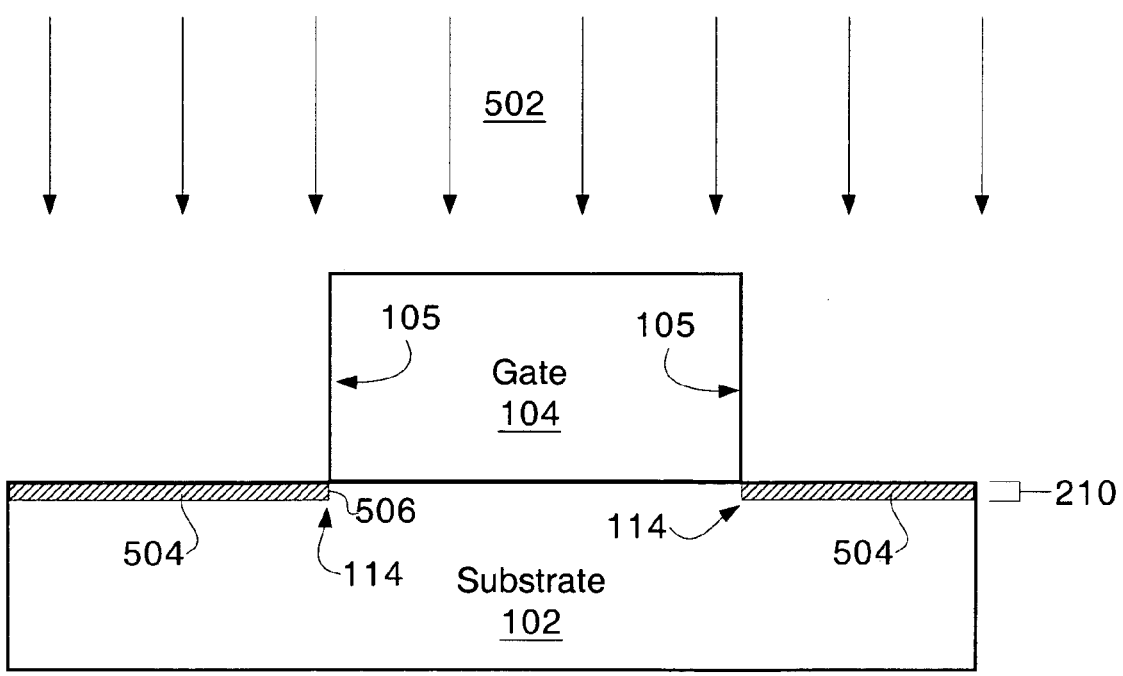
FIG. 5 is a cross sectional side view that illustrates the formation of the first implanted tip junction region.

Returning to FIG. 3, a first tip junction region may be formed 304. FIG. 5 is a cross sectional side view that illustrates the formation 304 of the first implanted tip junction region 504. The first implanted tip junction region 504 may be formed 304 by implanting ions 502, such as Arsenic ions, into the substrate 102 to a desired depth 210 of the first step 114 of the tip junction region 112. Part of the first implanted tip junction region 504 may form the first step 114, which may also be considered a first tip junction region where the tip junction region 112 includes multiple tip junction regions, or may be considered a first portion of the stepped tip junction region 112. The first step 114 may have an inner vertical boundary 506 adjacent the side wall 105 of the gate 104, below the gate 104. (Herein, "inner" is considered closer to the gate 104.) The boundary 506 may be at this location because ions 502 may be unable to penetrate through the gate 104 to the top surface of the substrate 102.

Figure 6:
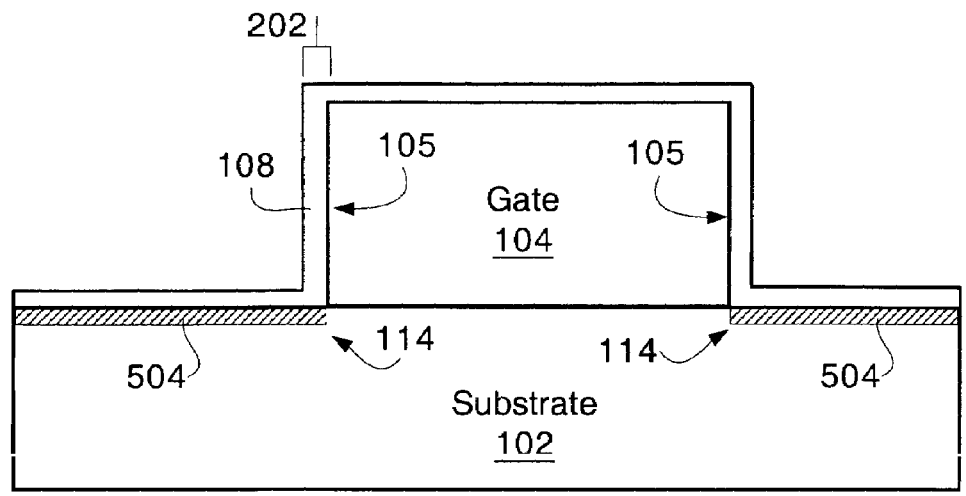
FIG. 6 is a cross sectional side view that illustrates the tip junction spacer layer formed on the substrate and gate.

Returning to FIG. 3, the tip junction spacer layer 108 may be formed 306. FIG. 6 is a cross sectional side view that illustrates the tip junction spacer layer 108 formed 306 on the substrate 102 and gate 104. The tip junction spacer layer 108 may be formed 306 by conformally or otherwise depositing a layer of nitride, oxide or another material on the substrate 102 and/or gate 104. In some embodiments, the tip junction spacer layer 108 may be deposited by chemical vapor deposition ("CVD") or another method. The thickness 202 of the deposited tip junction spacer layer 108 may be chosen to be a desired width of the first step 114 of the stepped tip junction region 112.

Figure 7:
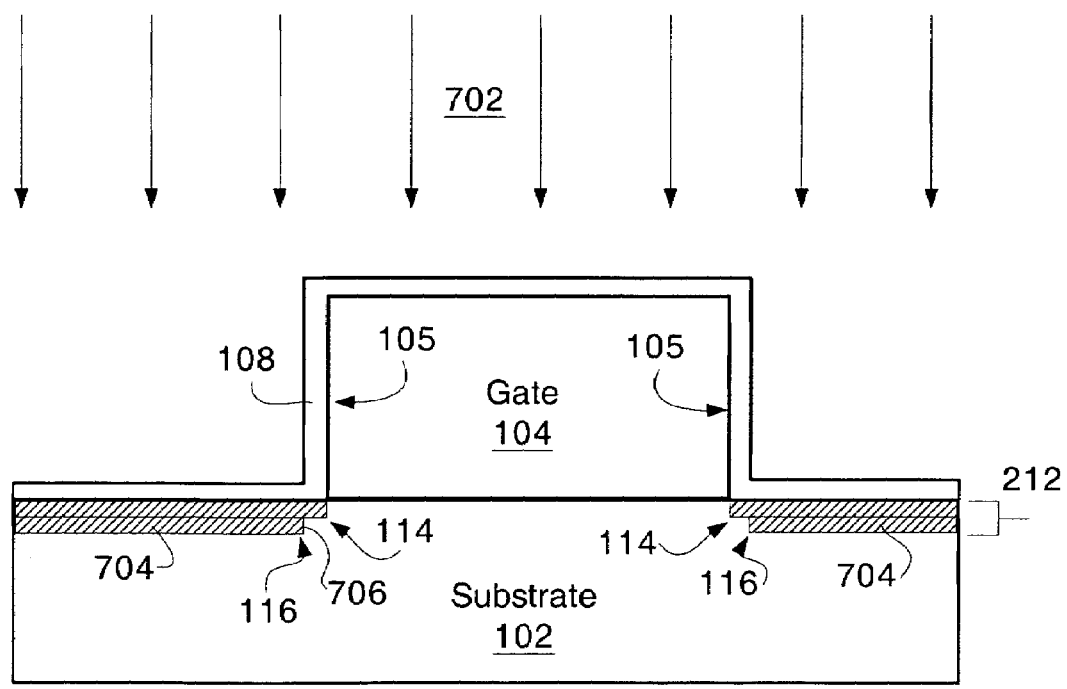
FIG. 7 is a cross sectional side view that illustrates the formation of the second implanted tip junction region.

Returning to FIG. 3, a second tip junction region may be formed 308. FIG. 7 is a cross sectional side view that illustrates the formation 308 of the second implanted tip junction region 704. The second implanted tip junction region 704 may be formed 308 by implanting ions 702, such as Arsenic ions, into the substrate 102 to a desired depth 212 of the second step 116 of the tip junction region 112. Part of the second implanted tip junction region 704 may form the second step 116, which may also be considered a second tip junction region where the tip junction region 112 includes multiple tip junction regions, or may be considered a second portion of the stepped tip junction region 112.

The second step 116 may have an inner vertical boundary 706 further from the side wall 105 of the gate 104 than the boundary 506 of the first step 114. The boundary 706 location may be determined by the thickness 202 of the tip junction spacer layer 108. Ions 702 may be able to penetrate through the tip junction spacer layer 108 on the top surface of the substrate 102 but be unable to penetrate to the substrate 102 through the tip junction spacer layer 108 on the side wall 105 of the gate 104.

Figure 8:
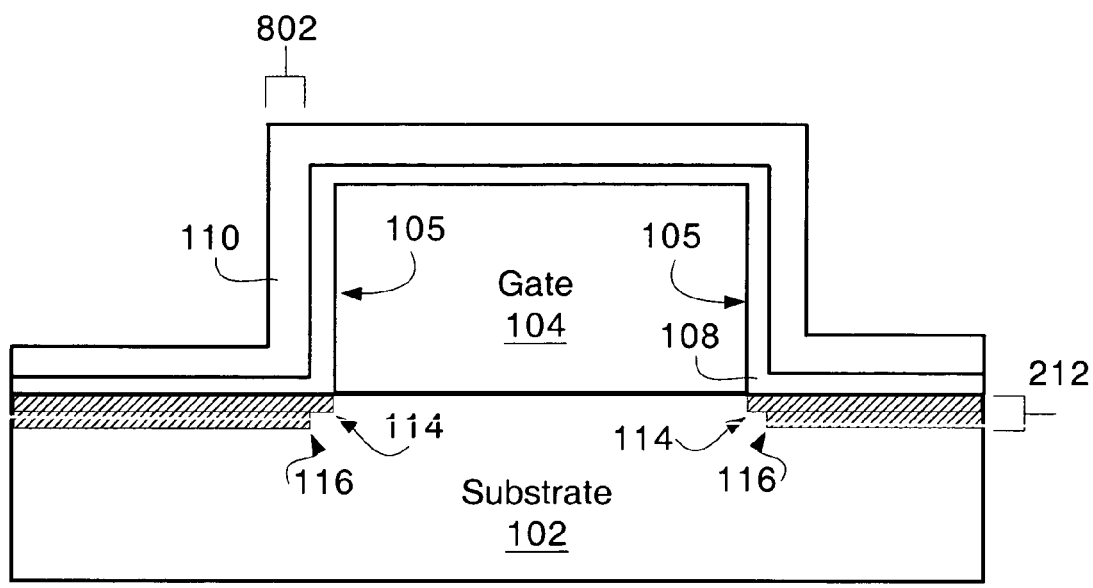
FIG. 8 is a cross sectional side view that illustrates the source/drain spacer layer formed on the tip junction spacer layer.

Returning to FIG. 3, the source/drain spacer layer 110 may be formed 310. FIG. 8 is a cross sectional side view that illustrates the source/drain spacer layer 110 formed 310 on the tip junction spacer layer 108. The source/drain spacer layer 110 may be formed 310 by conformally or otherwise depositing a layer of nitride, oxide or another material on the tip junction spacer layer 108. In some embodiments, the material of the source/drain spacer layer 110 may be the same material as that used to form the tip junction spacer layer 108. In some embodiments, the source/drain spacer layer 110 may be deposited by chemical vapor deposition ("CVD") or another method. The thickness 802 of the deposited source/drain spacer layer 110 may be chosen to be about that of a desired width of the second step 116 of the stepped tip junction region 112.

In some embodiments, the tip junction spacer layer 108 may remain in place and the source/drain spacer layer 110 formed on top of the tip junction spacer layer 108. The tip junction spacer layer 108 may thus remain in place as part of the spacer 107 after the transistor 100 is completed in some embodiments. Some such embodiments may lack a dry etch and/or wet cleaning process between formation of the source/drain spacer layer 110 and the tip junction spacer layer 108. This may avoid some unwanted etching of the substrate 102 and/or bleaching dopants from the substrate 102. In some such embodiments, the tip junction spacer 108 may be left in place on the top surface of the substrate 102 during formation of the source/drain regions 106 and not removed until after the source/drain regions 106 are formed.

Figure 9:
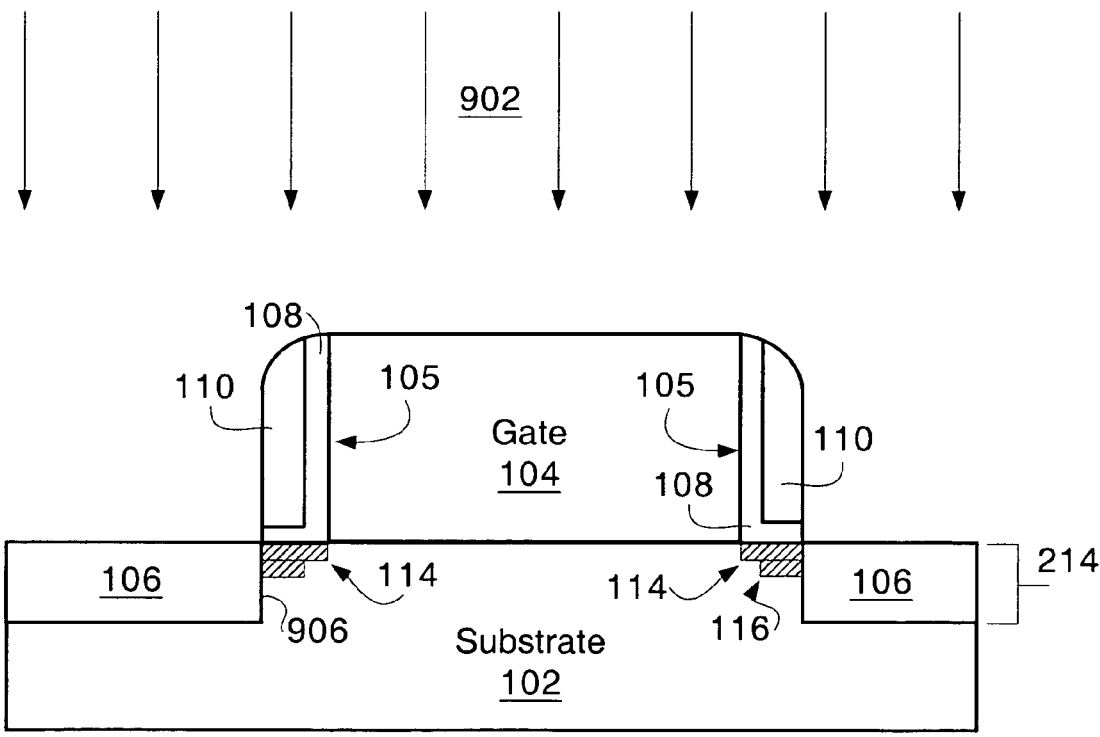
FIG. 9 is a cross sectional side view that illustrates the formation of the source/drain region.

Returning again to FIG. 3, the source/drain region 106 may be formed 312. FIG. 9 is a cross sectional side view that illustrates the formation 312 of the source/drain region 106. Part of the source/drain spacer layer 110 and the tip junction spacer layer 108 may be removed prior to forming 312 the source/drain region 106. For example, in some embodiments, a dry etch may be performed to remove part of the source/drain spacer layer 110 and the tip junction spacer layer 108. The result of such a dry etch is illustrated in FIG. 9, where the source/drain spacer layer 110 and the tip junction spacer layer 108 remains on the side walls 105 of the gate 104 but have been removed from the top of the gate 104 and from much of the surface of the substrate 102.

The source/drain region 106 may be formed 312 by implanting ions 902, such as Arsenic ions, into the substrate 102 to a desired depth 214 of the source/drain region 106. The source/drain region 106 may have an inner vertical boundary 906 further from the side wall 105 of the gate 104 than the boundary 706 of the second step 116. The boundary 906 location may be determined by the thickness 802 of the source/drain spacer layer 110. Most or all of the ions 902 may be unable to penetrate to the substrate 102 through the thickness of the tip junction spacer layer 108 and source/drain spacer layer 110 on the side wall 105 of the gate 104. This may result in the source/drain region 106 being spaced further from the gate 104 than the steps of the stepped tip junction region 112.

Returning to FIG. 3, additional processes may be used to finish 314 making the transistor 100 to result in a transistor similar to that described with respect to FIG. 1. For example, cleaning procedures may be performed to remove undesired material and/or contaminants from the surface of the substrate 102. Additional processes may also be used to finish the transistor.

Figure 10:
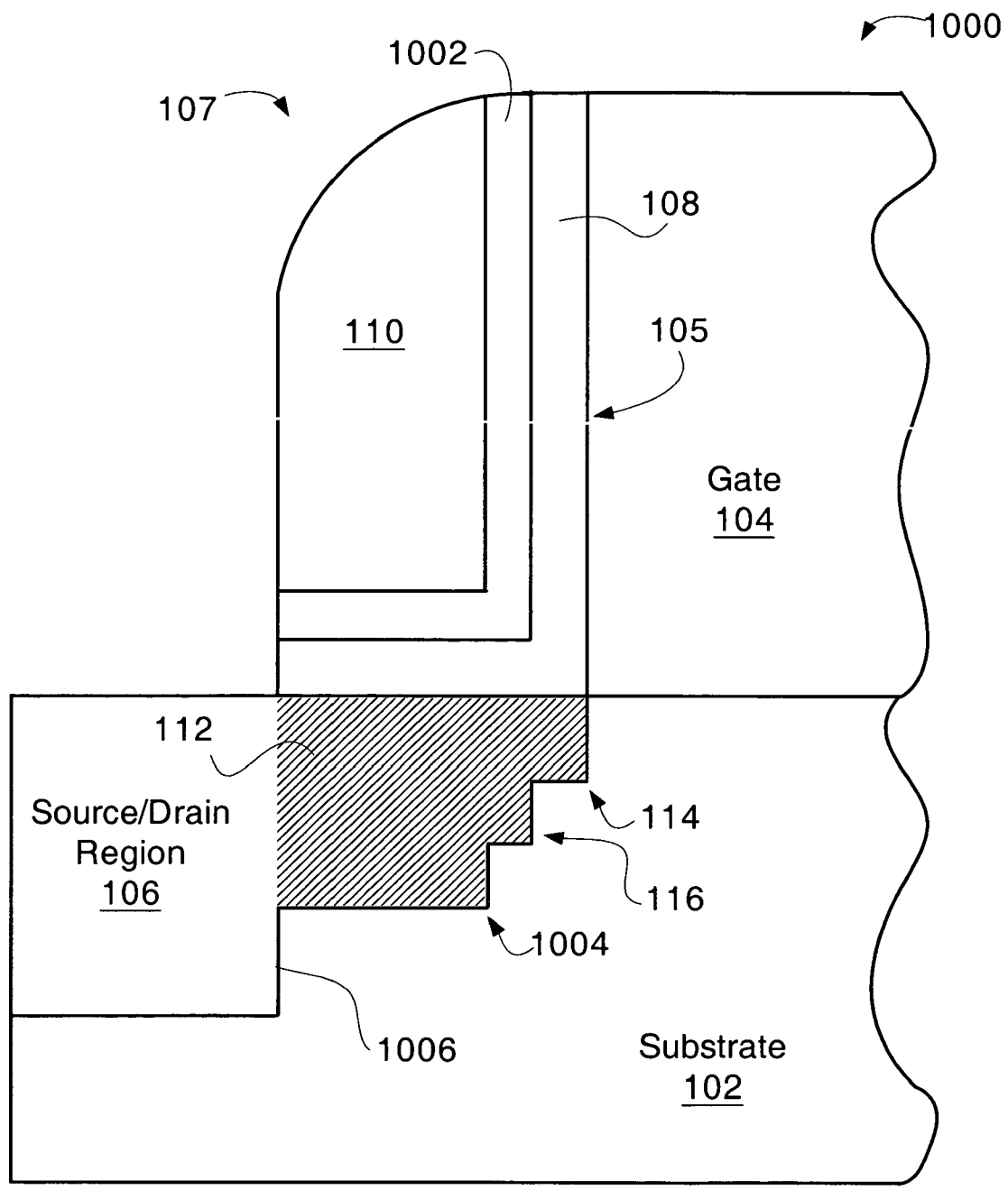
FIG. 10 is a close-up cross-sectional view of a transistor with a tip junction region having more than two steps.

FIG. 10 is a close-up cross-sectional view, similar to the view of FIG. 2, of a portion of a transistor 1000 with a tip junction region having more than two steps, according to an alternative embodiment of the present invention. Similar to FIG. 2, FIG. 10 illustrates a portion of the gate 104, a spacer 107, a portion of the substrate 102, a portion of a source/drain region 106, and a stepped tip junction region 112. However, the transistor 1000 in FIG. 10 has three steps instead of just two.

The transistor 1000 of FIG. 10 includes a first tip junction spacer layer 108. The first tip junction spacer layer 108 may, similarly to that described in FIG. 3, be used to create a second tip junction step 116 further from the gate 104 than the first step 114.

After formation of the second tip junction step 116, a second tip junction spacer layer 1002 may be formed on the first tip junction spacer layer 108. The second tip junction spacer layer 1002 may be used to create a third tip junction step 1004 further from the gate 104 than the second step 116. Similar to how the second tip junction step 116 may be formed as described above, the second tip junction spacer layer 1002 may prevent ions from penetrating through the portion of the second tip junction spacer layer 1002 on the side wall 105 of the gate 104, thus creating the third step 1004 with an inner vertical boundary 1006 further from the gate 104 than the boundary of the second step 116. In some embodiments, both the tip junction spacer layers 108, 1002 may be left in place on the side wall 105 of the gate 104 under the source/drain spacer layer 110 when the transistor 1000 is completed. Additional embodiments may also have more than three steps 114, 116, 1004 in the stepped tip junction region 112.

Figure 11:
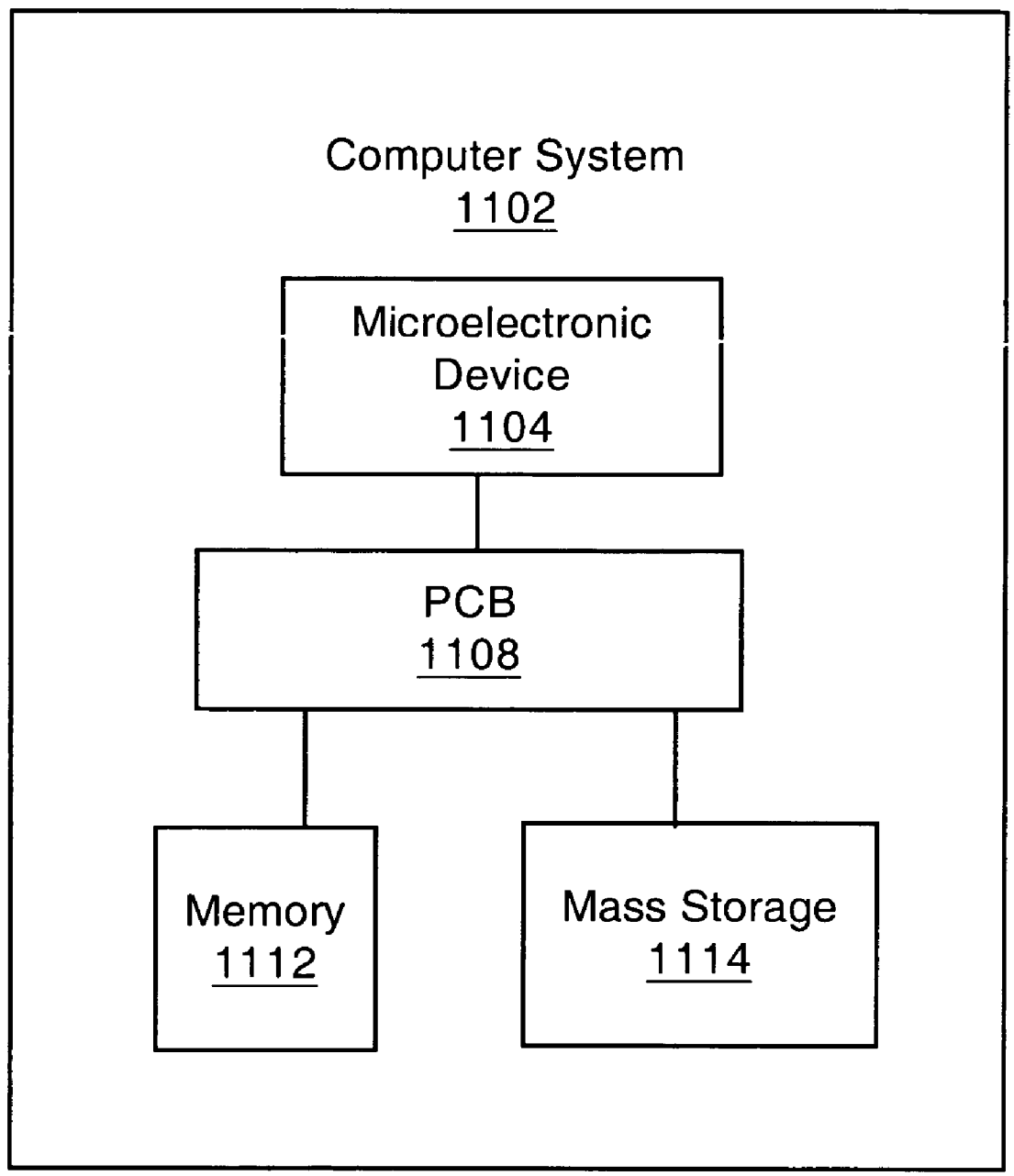
FIG. 11 is a schematic diagram of a computer system according to one embodiment of the present invention.

FIG. 11 is a schematic diagram of a computer system 1102 according to one embodiment of the present invention. The computer system 1102 may include the transistor 100 or 1000 described above. The transistor 100, 1000 may be part of a microprocessor die or other microelectronic device 1104 that may comprise part of the computer system 1102. Alternatively, the transistor 100, 1000 may be part of a memory 1112 in such a computer system 1102. The transistor 100, 1000 may also be used as part of other microelectronic devices.

The microelectronic device module 1104 of the computer system 1102 may be connected to a structure such as a printed circuit board ("PCB") 1108 by connectors such as solder balls or other connectors. Additionally, the computer system 1102 may include a memory II 12 and/or a mass storage unit 1114, which may be connected to the PCB 1108. The memory 1112 may be any memory, such as random access memory, read only memory, or other memories. The mass storage unit 1114 may be a hard disk drive, an EEPROM, or another mass storage device. The computer system 1102 may also include other components such as input/output units, a microprocessor, or other components. The computer system 1102 may be a "personal computer" such as are commonly used by individuals and businesses. Alternatively, the computer system 1102 may be other types of computers, such as a wireless phone having a microprocessor, memory, and/or other components.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A device, comprising:
   a substrate;
   a gate on the substrate;
   a spacer adjacent to a side wall of the gate, the spacer including:
      an L-shaped tip junction spacer layer having a vertical portion adjacent to the side wall of the gate and a horizontal portion extending away from the side wall of the gate and being adjacent to the substrate;
      a source/drain spacer layer on the tip junction spacer layer, the source/drain spacer layer not having an L-shape; and
      wherein the source/drain spacer layer has a width and the tip junction spacer layer has a width of about one half the width of the source/drain spacer layer or less;

a source/drain region in the substrate adjacent to the spacer; and a stepped tip junction region between the source/drain region and the gate, the stepped tip junction region having at least a first step and a second step.

2. A device, comprising:

a substrate;

a gate on the substrate;

a spacer adjacent to a side wall of the gate, the spacer including:

a tip junction spacer layer having a vertical portion adjacent to the side wall of the gate and a horizontal portion extending away from the side wall of the gate and the vertical portion and being adjacent to the substrate, wherein the tip junction spacer layer defines a concavity between the horizontal and vertical portions;

a source/drain spacer layer in the concavity of the tip junction spacer layer, the source/drain spacer layer having a substantially convex shape; and wherein the source/drain spacer layer has a width and the tip junction spacer layer has a width of about one half the width of the source/drain spacer layer or less;

a source/drain region having a depth;

a tip junction region, the tip junction region having a first portion with a first depth less than the depth of the source/drain region and extending closer to the gate than the source/drain region, and a second portion with a second depth less than the first depth and extending closer to the gate than the first portion; and wherein the first depth of the first portion of the tip junction region is at least about twice the second depth of the second portion of the tip junction region.

3. A method, comprising:

forming a gate layer on a substrate, the gate layer having a side wall;

forming a first tip junction region with a first depth below a top surface of the substrate and an inner vertical boundary adjacent to the side wall of the gate layer;

forming, after forming the first tip junction region, a first tip junction spacer layer with a width on the side wall of the gate layer, the first tip junction spacer layer having a vertical portion adjacent to the side wall of the gate layer and a horizontal portion extending away from the side wall of the gate and the vertical portion and being adjacent to the substrate, wherein the tip junction spacer layer defines a concavity between the horizontal and vertical portions;

forming a second tip junction region, after forming the first tip junction spacer, the second tip junction region having a second depth below the top surface of the substrate, the second depth being greater than the first depth, the second tip junction region having an inner vertical boundary at a larger distance from the side wall of the gate layer than the inner vertical boundary of the first tip junction region;

forming a source/drain spacer layer with a width in the concavity of the tip junction spacer layer after forming the second tip junction region, the width of the tip junction spacer layer being about one half the width of the source/drain spacer layer or less; and forming, after forming the source/drain spacer layer, a source/drain region with a third depth below the top surface of the substrate, the third depth being greater than the second depth, the source/drain region having an inner vertical boundary at a larger distance from the side wall of the gate layer than the inner vertical boundary of the second tip junction region.

4. The device of claim 1, wherein the tip junction spacer layer has a width and the first step has a width substantially equal to the width of the tip junction spacer layer.

5. The device of claim 4, wherein the tip junction spacer layer has a width less than about 20 nanometers.

6. The device of claim 1, wherein:

the spacer further includes a second tip junction spacer layer between the tip junction spacer layer and the source/drain spacer layer; and the stepped tip junction region has a third step.

7. The device of claim 1, wherein the tip junction spacer layer comprises at least one of nitride or oxide.

8. The device of claim 1, wherein the second step extends at least from the first step to an outer edge of the source/drain spacer layer.

9. The device of claim 1, wherein the first step has a first depth below a top surface of the substrate and the second step has a second depth below the top surface of the substrate, the second depth being at least about twice the first depth.

10. The device of claim 1, further comprising:

a microelectronic die including the substrate, gate, spacer, source/drain region and stepped tip junction region;

a structural support connected to the microelectronic die;

memory electrically coupled to the microelectronic die; and a mass storage unit electrically coupled to the microelectronic die.

11. The device of claim 2, wherein the tip junction region is at least partially beneath the spacer.

12. The device of claim 2, wherein the tip junction spacer layer has a width and second portion of the tip junction region extends closer to the gate than the first portion by a distance substantially equal to the width of the tip junction spacer layer.

13. The device of claim 2, wherein:

a second tip junction spacer layer; and the tip junction region further has a third portion with a third depth greater than the first depth and less than the depth of the source/drain region and extending closer to the gate than the source/drain region, but not extending as close to the gate as the first portion.

14. The device of claim 2, wherein the substrate, gate, spacer, source/drain region and stepped tip junction region are part of a transistor, and further comprising:

a microelectronic die;

a structural support connected to the microelectronic die;

memory electrically coupled to the microelectronic die; and wherein the transistor is a component of one of the microelectronic die or the memory.

15. The method of claim 3, wherein the second tip junction region is formed by implanting ions through the first tip junction spacer layer.

16. The method of claim 3, wherein the tip junction spacer layer has a width and the inner vertical boundary of the second tip junction region is further from the gate than the inner vertical boundary of the first tip junction region by a distance substantially equal to the width of the tip junction spacer layer.

17. The device of claim 1, wherein both the tip junction spacer layer and the source/drain spacer layer substantially consist of the same material.

* * * * *